United States Patent [19]
Fandrich et al.

[11] Patent Number: 5,224,070
[45] Date of Patent: Jun. 29, 1993

[54] APPARATUS FOR DETERMINING THE CONDITION OF PROGRAMMING CIRCUITRY USED WITH FLASH EEPROM MEMORY

[75] Inventors: Mickey L. Fandrich, Placerville; Virgil N. Kynett, El Dorado Hills; Kurt Robinson, Newcastle, all of Calif.

[73] Assignee: Intel Corporation, Santa Clara, Calif.

[21] Appl. No.: 804,965

[22] Filed: Dec. 11, 1991

[51] Int. Cl.⁵ .......................................... G11C 11/40
[52] U.S. Cl. .................................. 365/185; 365/201; 365/900
[58] Field of Search ............... 365/900, 218, 185, 200, 365/201

[56] References Cited

U.S. PATENT DOCUMENTS

| | | |
|---|---|---|
| 3,801,802 | 4/1974 | Barwig et al. ...................... 365/201 |
| 4,279,024 | 7/1981 | Schrenk ............................... 365/203 |
| 4,758,988 | 7/1988 | Kuo ................................. 365/200 X |
| 4,970,692 | 11/1990 | Ali et al. .......................... 365/900 X |
| 5,124,945 | 6/1992 | Schreck .............................. 365/185 |
| 5,151,881 | 9/1992 | Kajigaya et al. ............... 365/201 X |
| 5,179,537 | 1/1993 | Matsumoto ........................ 365/201 |

Primary Examiner—Eugene R. LaRoche
Assistant Examiner—Son Dinh
Attorney, Agent, or Firm—Blakely, Sokoloff, Taylor & Zafman

[57] ABSTRACT

A circuit which monitors the internal state of flash memory array programming circuitry and conveys that state to circuitry external to the flash memory array so that external circuitry need not delay during any period in which a programming operation is taking place within the flash memory array.

8 Claims, 3 Drawing Sheets

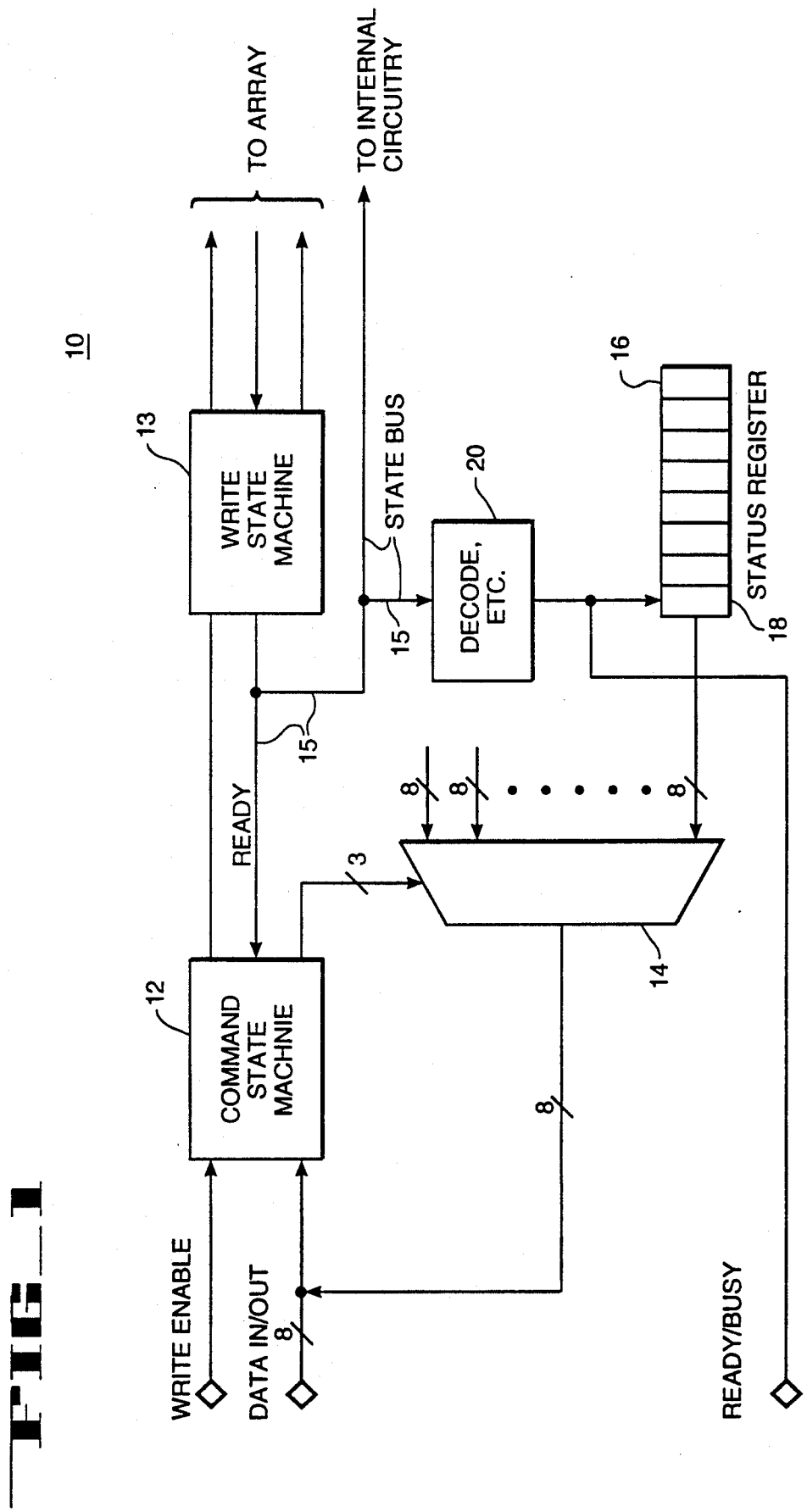
FIG_1

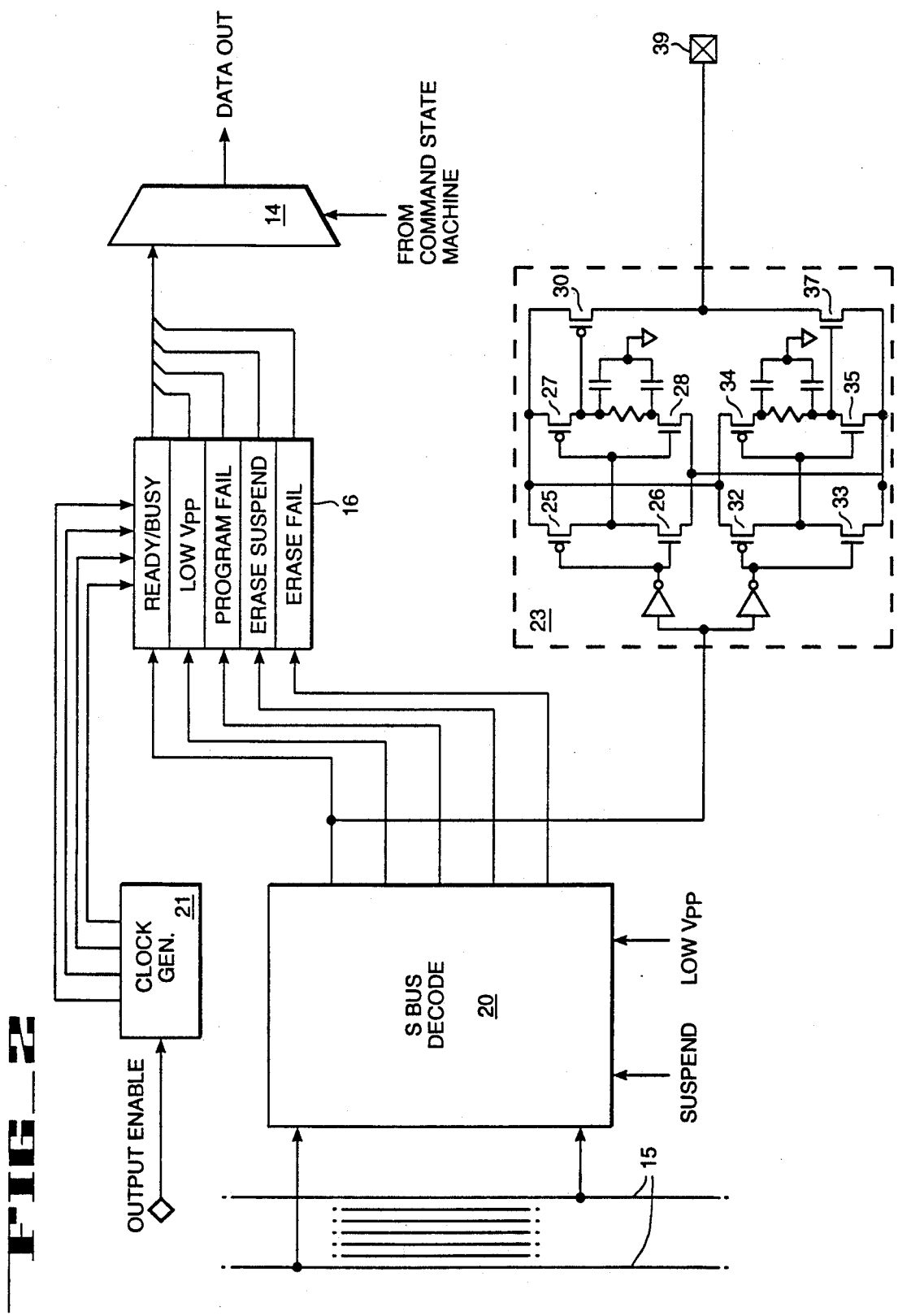
FIG._2

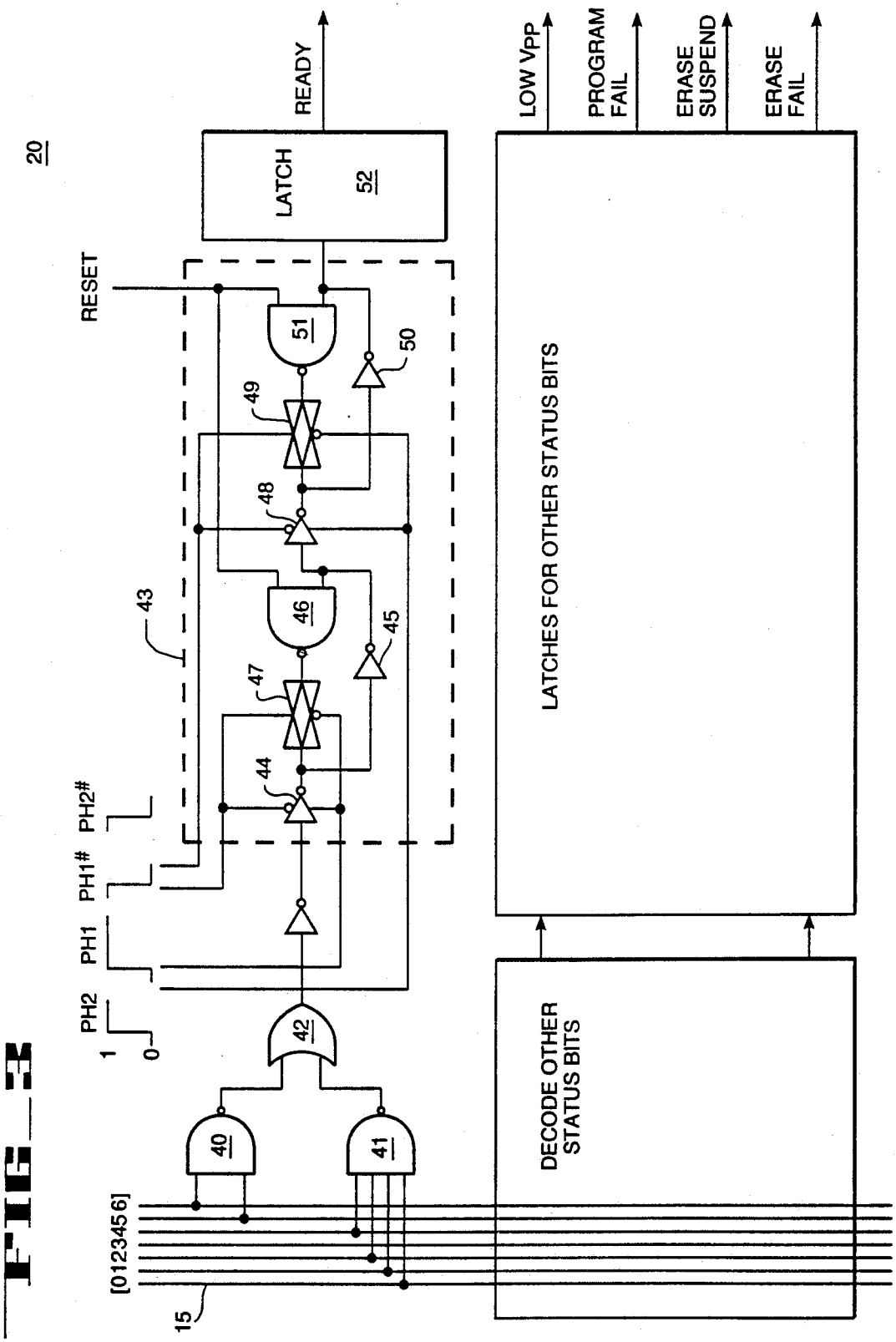
FIG_3

APPARATUS FOR DETERMINING THE CONDITION OF PROGRAMMING CIRCUITRY USED WITH FLASH EEPROM MEMORY

BACKGROUND OF THE INVENTION

1. Field Of The Invention

This invention relates to flash EEPROM (electrically erasable programmable read only) memories and, more particularly, to apparatus for causing a flash EEPROM memory to generate a signal indicating the status of an internally controlled operation.

2. History Of The Prior Art

Recently, a new type of electrically erasable programmable read only memory called flash EEPROM has been devised. Such a memory array is disclosed in U.S. patent application Ser. No. 667,905, *entitled LOW VOLTAGE EEPROM CELL*, Lai et al, filed Nov. 2, 1984, and assigned to the assignee of the present invention. Flash EEPROM may be electrically erased and reprogrammed without removing the memory from the system. Flash EEPROM memory arrays are popular because they are a relatively inexpensive way to provide large memory arrays which may be reprogrammed without removing them from a system with which they are used. Flash EEPROM is available in memory arrays up to two megabits.

A difficulty with flash EEPROM, however, is that erasure is accomplished by applying a high voltage to the source terminals of all of the transistors (cells) used in the memory. Because these source terminals are all connected by metallic busing in the array, the entire array is erased and must be reprogrammed. Thus, the reprogramming effort required for flash EEPROM is very extensive.

Because of this, with large arrays there are a great number of chances for one programming flash EEPROM to inadvertently provide incorrect commands to the chip. Although some of these incorrect commands may have no effect on the operation of the circuitry, others may have a very deleterious effect. Initial efforts with flash EEPROM have disclosed that the programming of such circuitry is so complicated that it is desirable to limit the ability of a programmer to provide inadvertent commands which may adversely affect the flash EEPROM.

To overcome this problem, an arrangement has been devised by which circuitry called command interface circuitry is interposed between the programmer and the flash EEPROM circuitry U.S. patent application Ser. No. 665,643, entitled COMMAND STATE MACHINE, M. Fandrich et al, filed Feb. 11, 1991, and assigned to the assignee of the present invention discloses such an arrangement. The arrangement controls the transfer of signals to and from the flash EEPROM and eliminates the ability of the programmer to provide signal combinations which might be able to affect the circuitry of the memory array in an undesirable manner. Essentially, the invention eliminates the possibility of generating unwanted, undesirable, and unknown combinations of signals which might somehow create a defect in the operation of the memory array.

The command state machine and its associated circuitry receive the commands from a programmer and accomplish the various allowed results. The command state machine controls a write state machine which accomplishes both write operations and erase operations. The time required for each of these operations is significantly longer than is the time required for writing or erasing conventional memory. For example, a write to the flash EEPROM may require approximately ten microseconds rather than the typical 120 nanoseconds required for writing to more conventional memory. An erase operation typically requires up to onehalf a second to accomplish.

Even though these times are long, there are still many situations in which it is desirable to write to and erase flash EEPROM during the operation of the computer system of which it is a part. If the other circuitry in the computer system must wait for a write to or the erasure of the flash memory, the system delay will be very extensive. For example, if a central processor initiates a write operation by the command state machine controlling the programming of a flash memory array and then must wait for the result of that operation before it can proceed, the delay to the system is inordinate compared to a typical computer wait period. It is, therefore, desirable that such delays be obviated in some manner.

SUMMARY OF THE INVENTION

It is, therefore, an object of the present invention to provide an arrangement for obviating the delay attendant on the programming of flash memory arrays having internal programming circuitry which controls the programming and erasure of the memory arrays.

These and other objects of the present invention are realized in a circuit which monitors the internal state of flash memory array programming circuitry and conveys that state to circuitry external to the flash memory array so that the external circuitry need not delay during any period in which a programming or an erase operation is taking place within the flash memory array.

These and other objects and features of the invention will be better understood by reference to the detailed description which follows taken together with the drawing in which like elements are referred to by like designations throughout the several views.

BRIEF DESCRIPTION OF THE DRAWINGS

FIG. 1 is a partially-block partially-schematic circuit diagram illustrating the present invention.

FIG. 2 is a partially-block partially-schematic diagram illustrating circuitry by which the present invention is practiced.

FIG. 3 is a partially-block partially-schematic diagram illustrating in detail certain of the circuitry shown in FIG. 2.

DETAILED DESCRIPTION OF THE INVENTION

Referring now to FIG. 1, there is illustrated in broad outline a circuit 10 which controls the programming and erasing of a flash memory array (not itself shown in the figure). The circuit 10 includes a command state machine 12 which is interposed between a programmer and the flash memory array. The command state machine 12 limits the commands which can be presented to the array to a specific set of commands which can only be presented in certain conditions of the array and its associated circuitry. When presented any of these commands, the command state machine 12 controls their execution. Various precautions are designed into the command state machine 12 and its associated circuitry so that only the allowed commands and no extraneous signals of any sort may be presented to the array. In this manner, programming errors which might harm the array or its associated circuitry are eliminated. The details of the command state machine 12 and its operation are described in the copending U.S. patent application entitled COMMAND STATE MACHINE, referred to above.

The actual programming and erasure of the memory array are controlled by the command state machine 12 through a write state machine 13 which applies the various high voltage signals necessary to erase and write to the array. The details of the write state machine 13 and its operation are described in U.S. patent application Ser. No. 654,375, entitled CIRCUITRY AND METHOD FOR PROGRAMMING AND ERASING A NON-VOLATILE SEMICONDUCTOR MEMORY, V. Kynett et al, filed Feb. 11, 1991, and assigned to the assignee of the present invention.

The command state machine 12 monitors all incoming commands and allows access to the write state machine 13 only when the write state machine 13 is not either programming the memory array or erasing the array. If the write state machine 13 is engaged in either of these operations, access to the write state machine 13 is precluded by the command state machine 12. In order to assure that this control occurs, the write state machine 13 furnishes signals indicating its operating status to the command state machine 12 and other elements of the circuit 10 using a state bus 15. The state bus 15 runs throughout the circuit 10 and indicates the operating state of the write state machine 13 to the components with which it associates. Using the state signals transferred on the state bus 15, the command state machine 12 may know the condition of the write state machine 13 and exclude commands from interfering with its operation when it is programming or erasing the memory array.

The circuit 10 also includes a status register 16 in which the signals on the state bus 15 indicating the state of operation of the write state machine 13 are stored. The status register 16 is a five bit register in the preferred embodiment and stores bits indicating that an erase operation has failed, that an erase operation has been suspended, that a programming operation has failed, that the write state machine 13 has insufficient voltage Vpp for a write or erase operation, and that the write state machine 13 is either busy (programming or erasing) or is free to undertake those operations. The status register 16 receives its information regarding the various conditions of the write state machine 13 on the state bus 15 via decoding circuit 20.

The circuit 10 also includes a multiplexor 14 which is controlled by the command state machine 12. The multiplexor 14 is utilized by the command state machine 12 to transfer various information out of the circuit 10. For example, the command state machine 12 may cause the multiplexor 14 to transfer data read from the memory array to circuitry external to the circuit 10. Another type of information which may be transferred by the multiplexor 14 is data giving the signature (manufacturer, type, model) of the particular memory array hardware. Among other information available is the condition of the bits held in the status register 16. This information is available for transfer externally under interrogation by some external circuit such as a microprocessor.

In order to speed the operation of the system circuitry external to the circuit 10, the present invention utilizes the data indicating the state of operation of the write state machine 13 furnished on the state bus 15 to provide an external signal which indicates whether the write state machine 13 is busy writing or erasing the array or is ready to undertake another operation. Using this signal, an interrupt signal may be generated for an associated microprocessor, for instance, to indicate to that microprocessor when the write state machine 13 is available for new operations. In this manner, the microprocessor need not delay its operation during the period in which the write state machine 13 is carrying out any particular operation. The microprocessor may initiate an operation by the write state machine 13 and then go on to other operations. When the write state machine 13 has completed the operation initiated by the microprocessor the external ready signal is generated; and an interrupt may be sent to indicate to the microprocessor that the operation is complete. Thus, no delay of the microprocessor or other system components is required; and the speed of the entire system is enhanced.

FIG. 2 is a circuit diagram illustrating specific circuitry utilized for carrying out the preferred embodiment of the invention. At the left of the drawing in FIG. 2 is shown the state bus 15 which carries the information regarding the status of the write state machine 13. In the preferred embodiment of the invention, the bus 15 is a seven wire bus. A decode circuit 20 decodes the status information available on the wires of the bus 15, combines that information with certain commands (suspend and low power) from the command state machine 12, and provides the five state bits described above which indicate the condition of the write state machine 13. The decode circuit 20 decodes the information from the state bus 15 and utilizes latches for providing output signals indicating the status of the write state machine 13. The details of the circuitry and operation of the decode circuit 20 as they are pertinent to this invention are discussed in detail below with respect to FIG. 3.

One of the bits of status information determined by the decode circuit 20 is a bit which indicates whether the write state machine 13 is presently involved in either writing to the flash EEPROM array or in erasing that array. This bit along with the other status bits are transferred to the status register 16. The status register 16 in the preferred embodiment includes five individual two stage master-slave latches which store the individual bits of status information. These master-slave latches are identical to the latches described in FIG. 3 as a part of the decode circuit 20. An output enable signal OEB is furnished to a clock generator circuit 21 which generates master and slave clock signals for clocking the status bits into and providing output signals from the latches of the status register 16. The output of the status register 16 is provided on the data output lines by the multiplexor 14 under command of the command state machine 12 (not shown in FIG. 2).

The READY signal which provides the ready bit for the status register 16 is also transferred to an output driver circuit 23. The driver circuit 23 inverts the signal provided and furnishes it to two parallel stages of inverters. The upper stage as shown in the figure includes a first inverter including a P channel FET 25 and an N channel FET 26. The output of the first inverter is transferred to a second inverter including a P channel FET 27 and an N channel FET 28. The output of this second inverter is transferred to the gate terminal of a large P channel FET 30. In a similar manner, the ready signal is inverted and provided to a second stage of inverters. This second stage includes a first inverter including a P channel FET 32 and an N channel FET 33. The output of the first inverter of the second stage is transferred to a second inverter including a P channel FET 34 and an N channel FET 35. The output of this second inverter is transferred to the gate terminal of a large N channel FET 37.

The two transistors 30 and 32 together form a final output stage capable of providing the output current necessary to a full output driver. Depending on the condition of the ready signal, an output voltage of ground or Vcc is provided at a terminal 39 to signal to the circuitry external to the circuit 10 the ready/busy condition of the write state machine 13.

FIG. 3 illustrates the details of the decode circuit 20 and includes a description of the master-slave latches which are used both in the decode circuit 20 and the status register 16 in the preferred embodiment of the invention. A pair of NAND gates 40 and 41 receive the signals from the individual wires [0:6] of the state bus 15. In the preferred embodiment, a signal pattern in which the wire 0 carries a one while the wires 1,2 and 4-6 carry zeroes indicates that the write state machine 13 is in the ready state and can receive commands to erase or program from the command state machine 12. As may be seen, this set of signals causes the two NAND gates 40 and 41 to generate ones at their output terminals so that an OR gate 42 transfers a one to a latch 43.

The latch 43 receives the input signal at the input terminal of a first tristate inverter 44, the input to the master stage of the latch 43. Four clock signals PH1, PH1#, PH2, and PH2# which are generated off of the write state machine clocks are also transferred to the latch 43. One clock period of each of the clocks PHI and PH2 is shown adjacent the terminals at which those clocks are received in the figure; the signals PH1# and Ph2# are complements of the signals PH1 and PH2. The latch 43 also receives a reset signal which is not pertinent to this specification.

As may be seen, the clock PH1 and its complement PH1# turn on the tristate inverter 44 and invert and transfer the value at its input to its output terminal. This inverted value is transferred by an inverter 45 to the input of a NAND gate 46 which also receives the reset signal. Typically, the reset signal is a one so the NAND gate 46 inverts whatever signal is generated by the inverter 45. Thus, both sides of a transmission gate 47 have the same signal applied. A transmission gate is well known in the art and is essentially an N channel FET and a P channel FET with their sources and drains connected and their gate terminals arranged to receive opposite values of the same enabling signal, here the clocks PH1 and PH1#. Thus, the transmission gate 47 is not conducting when the READY signal is first transferred by the tristate inverter 44. However, when the clock PH1 goes low to turn off the tristate inverter 44, the transmission gate 47 is turned on. Thus, the state of the READY signal is stored and furnished by the inverter 45 to the input of a tristate inverter 48 of the slave portion of the latch 43.

The inverter 48 is turned on by the clock PH2 going high and transfers the signal at its input to one side of another transmission gate 49 and through an inverter 50 to an input of a NAND gate 51. Thus, the transmission gate 49 which is initially off has the same signal applied to the drain and source terminals of both of its transistors.

When the clock PH2 goes low, the transmission gate 49 is switched on; and the input signal stored and transferred to the input of a next latch 52. The latch 52 is identical to the latch 43 and accomplishes the same two stage transfer of the signal at its input terminal to its output terminal to produce the ready/busy state signal.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. Circuitry within a FLASH EEPROM memory for indicating a state of the FLASH EEPROM memory to an external device, the FLASH EEPROM memory including a memory array and programming circuitry for programming and erasing the memory array, the circuitry comprising:
   (a) a state bus carrying a multiplicity of signals output by the programming circuitry;
   (b) a decoder coupled to the state bus and outputting a ready/busy signal, the ready/busy signal having a busy state and a ready state, the busy state indicating that the programming circuitry is programming or erasing the memory array, the ready state indicating that the programming circuitry is ready to begin programming or erasing the memory array; and
   (c) a driver circuit for receiving the ready/busy signal from the decoder and outputting a modified ready/busy signal to the external device, the modified ready/busy signal having a modified busy state and a modified ready state, the modified busy state being associated with the busy state and the modified ready state being associated with the ready state, the modified ready state interrupting the external device.

2. The circuitry of claim 1 wherein the driver circuit comprises:
   (a) a first inverter state having an input coupled to the ready/busy signal, the first inverter state having a first inverter output;
   (b) a second inverter stage having an input coupled to the ready/busy signal, the second inverter stage having a second inverter output;
   (c) a P channel field effect transistor having a gate coupled to the first inverter output, and a P channel output; and
   (d) an N channel field effect transistor having a gate coupled to the second inverter output and an N channel output coupled to the P-channel output and the sternal device.

3. The circuitry of claim 1 wherein the decoder comprises:
   (a) a first NAND gate having inputs coupled to a first set of signals carried by the state bus, the first NAND gate having a first NAND output;
   (b) a second NAND gate having inputs coupled to a second set of signals carried by the state bus, the second set of signals not including the first set of signals, the second NAND gate having a second NAND output;
   (c) a first NOR gate having inputs coupled to the first NAND output and the second NAND output, the first NOR gate having a NOR output;

(d) a latch having an input coupled to the NOR output, the latch outputting the ready/busy signal.

4. The circuitry of claim 1 wherein the external device is a microprocessor.

5. Circuitry within a FLASH EEPROM memory for indicating a state of the FLASH EEPROM memory to an external device, the FLASH EEPROM memory including a memory array and programming circuitry for programming and erasing the memory array, the circuitry comprising:
   (a) a state bus coupled to the decoder, the state bus carrying the multiplicity of signals indicative of the current state of the programming circuitry;
   (b) a decoder coupled to the state bus for decoding a current state of the programming circuitry and outputting a multiplicity of decoded signals including a ready/busy signal, the ready/busy signal having a busy state and a ready state, the busy state indicating that the programming circuitry is busy programming or erasing the memory array, the ready state indicating that the programming circuitry is ready to begin programming or erasing the memory array;
   (c) a status register coupled to the decoder for storing the multiplicity of decoder signals; and
   (d) a driver circuit for receiving the ready/busy signal from the decoder and an outputting a modified ready/busy signal to the external device, the modified ready/busy signal having a modified busy state and a modified ready state, the modified busy state being associated with the busy state and the modified ready state being associated with the ready state, the modified ready state interrupting the external device.

6. The circuitry of claim 5 wherein the driver circuit comprises:
   (a) a first inverter stage having an input coupled to the ready/busy signal, the first inverter stage having a first inverter output;
   (b) a second inverter stage having an input coupled to the ready/busy signal, the second inverter stage having a second inverter output;
   (c) a P channel field effect transistor having a gate coupled to the first inverter output, and a P channel output; and
   (d) an N channel field effect transistor having a gate coupled to the second inverter output and an N channel output coupled to the P-channel output and the external device.

7. The circuitry of claim 5 wherein the decoder comprises:
   (a) a first NAND gate having inputs coupled to a first set of signals carried by the state bus, the first NAND gate having a first NAND output;
   (b) a second NAND gate having inputs coupled to a second set of signals carried by the sate bus, the second set of signals not including the first set of signals, the second NAND gate having a second NAND output;
   (c) a first NOR gate having inputs coupled to the first NAND output and the second NAND output, the first NOR gate having a NOR output;
   (d) a latch having an input coupled to the NOR output, the latch outputting the ready/busy signal.

8. The circuitry of claim 5 wherein the external device is a microprocessor.

* * * * *

UNITED STATES PATENT AND TRADEMARK OFFICE
CERTIFICATE OF CORRECTION

PATENT NO. : 5,224,070
DATED : June 29, 1993
INVENTOR(S) : Mickey L. Fandrich, et al It is certified that error appears in the above-indentified patent and that said Letters Patent is hereby corrected as shown below:

Col. 6, Line 42   Delete "state"    Insert --stage--

Col. 6, Line 43   Delete "state"    Insert --stage--

Col. 6, Line 54   Delete "sternal"  Insert --external--

Signed and Sealed this

Twenty-second Day of March, 1994

Attest:

BRUCE LEHMAN

Attesting Officer    Commissioner of Patents and Trademarks